United States Patent [19]

Krueger et al.

[11] 4,044,816
[45] Aug. 30, 1977

[54] FORMATION OF METAL PARTS

[75] Inventors: Theodore H. Krueger, Lincoln; Robert Eller, Boston; John O'Brien, Winchester; William L. Robbins, Newton, all of Mass.

[73] Assignee: Theodore H. Krueger, Lincoln, Mass.

[21] Appl. No.: 648,315

[22] Filed: Jan. 12, 1976

Related U.S. Application Data

[62] Division of Ser. No. 588,283, June 19, 1975.

[51] Int. Cl.² .................. B22D 25/00; B22D 27/16
[52] U.S. Cl. ............................... 164/63; 29/628; 164/98
[58] Field of Search .............. 164/61, 63, 255, 98; 174/52 FP; 29/625, 628; 228/164, 242

[56] References Cited

U.S. PATENT DOCUMENTS

| | | | |
|---|---|---|---|
| 2,809,407 | 10/1957 | Thomson et al. | 164/63 |
| 3,702,500 | 11/1972 | Gorinas et al. | 29/628 |
| 3,789,910 | 2/1974 | Matter et al. | 164/255 X |

Primary Examiner—Robert D. Baldwin
Attorney, Agent, or Firm—Schiller & Pandiscio

[57] ABSTRACT

The invention provides a new apparatus and method for forming thin metal parts of simple or intricate shape and depositing the same onto selected receiving surfaces. The parts may be in the form of wire leads which are bonded to the receiving surfaces. The invention consists in providing a hollow tool which includes a porous body with an exposed surface having a selected two-dimensional or three-dimensional geometry, immersing the surface of the porous body in a melt of a metal which will not wet the surface, pulling the tool away from the melt while applying a suction force to the porous body so that a portion of the melt will adhere to the surface, bringing the tool into contact with a receiving surface, and cooling the surface and removing the suction force so that the adhering portion of the melt will be deposited as a solid or partially solidified body onto the receiving surface. The deposited part will bond securely to the receiving surface if the latter is made of a material which is wetted by the melt.

17 Claims, 11 Drawing Figures

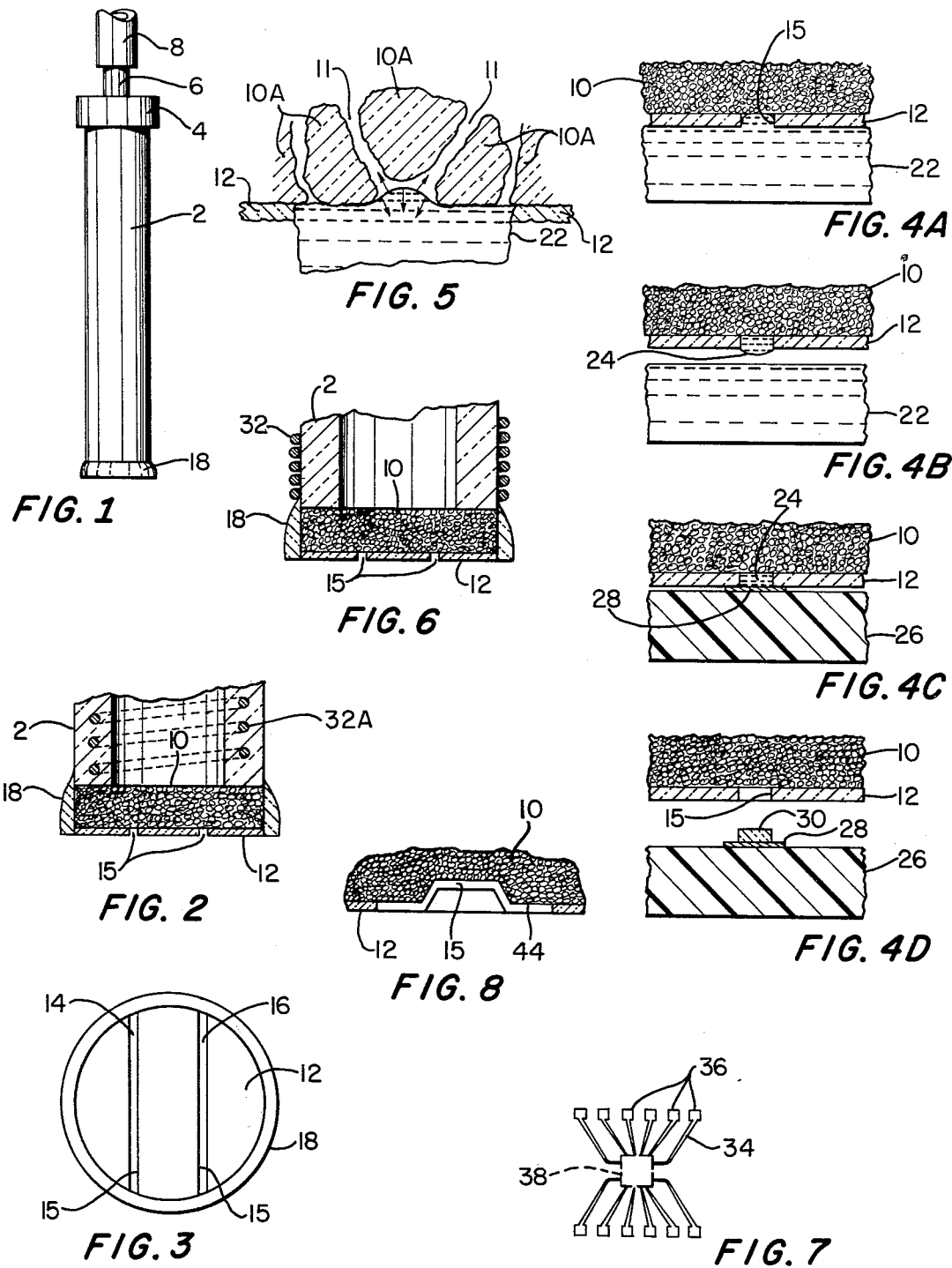

FORMATION OF METAL PARTS

This application is a division of our copending application Ser. No. 588,283, filed June 19, 1975 for Formation of Metal Parts.

This invention relates to production of thin metal parts and more particularly to a method for forming shaped parts from a film or layer of a liquid metal or alloy.

It is desirable in certain industries to provide thin relatively small metal parts of simple or complex shape and to bond or mount such parts to other components. Thus, for example, the manufacture of integrated circuits involves preforming miniature lead frames, placing each lead frame in registration with an IC chip, and welding or otherwise bonding the individual leads or fingers of the lead frame to selected terminal pads on the chip.

Manufacturing engineers have focussed on the relatively high labor costs involved in the process of interconnecting and assembling electrical products and extensive efforts have been made to develop new automation techniques calculated to reduce assembly costs. One such automation technique for reducing IC chip-to-lead frame assembly costs is described by Stepher E. Grossman, "Film-Carrier Technique Automates the Packaging of IC Chips," Electronics, pp. 89-95, May 16, 1974. While the technique described by Grossman is advantageous for high volume manufacturing facilities, it is less attractive in the case of low volume production lines due to the cost of implementing its use. Also it suffers from the disadvantage that it requires the lead frame to be pre-formed and to be conveyed by a plastic film carrier to a bonding station where it is attached to an IC chip. The film carrier is expensive, yet it plays no role once the bonding is accomplished and must be separated from the completed IC chip-lead frame unit.

Of course many products still require discrete electrical or electronic components to be interconnected by individual wire leads of different lengths, e.g. the interconnection of a spatial array of resistors, capacitors, transistors, diodes, etc. The tailoring of the wire leads involved in the manufacture of such products constitutes a substantial cost factor. Therefore it is desirable to provide a method of automating the interconnecting of electrical and electronic components by tailored wire leads.

Accordingly one primary object of this invention is to provide a method of connecting together two or more electronic or electrical components with wire leads that are tailored by forming them in situ.

Another primary object of this invention is to provide a method for forming thin, relatively small and simple or intricate metal parts.

Another object of this invention is to provide an apparatus and method for forming thin, relatively small metal parts of simple or intricate shape and transferring and/or bonding such parts to other components.

These and other objects hereinafter described or rendered obvious are achieved by providing and using a forming head which comprises a tubular support, a porous body attached to the tubular support which is not wettable by the metal or alloy to be used, a non-porous coating on said porous body which is non-wettable by the same metal or alloy and which exposes a portion of said porous body to said metal or alloy according to a predetermined design, and means for connecting the tubular support to a source of vacuum so as to draw said metal or alloy against the exposed portions of said porous body. The forming head may include an electrical heating element to maintain the vacuum-held metal or alloy in a molten condition. Also the forming head may be adapted for use as a manual tool or it may be deployable by non-manual means such as a mechanical positioning and motion producing device.

Other features, modifications and advantages of the invention are set forth in the following detailed description which is to be considered together with the accompanying drawings wherein:

FIG. 1 is a view in elevation of a forming head illustrating a preferred mode of constructing the apparatus of the invention;

FIG. 2 is a fragmentary longitudinal sectional view on an enlarged scale of the bottom end of the forming head of FIG. 1;

FIG. 3 is a bottom view of the bottom end of the same forming head;

FIGS. 4A-4D are fragmentary sectional views on a much larger scale than FIG. 2 illustrating how the same forming head is employed to form and deposit a thin metal part according to the invention;

FIG. 5 is a sectional view of the bottom end of the forming head on a much larger scale than FIGS. 4A-4D;

FIG. 6 shows a forming head with a heater;

FIG. 7 illustrates an array of leads corresponding to a lead frame for a semiconductor circuit chip that may be formed by use of the present invention; and FIG. 8 illustrates a modification of the invention.

Referring now to FIGS. 1 and 2, there is shown a manually or mechanically deployable forming tool which comprises an elongate tubular body 2 which has an end cap 4 attached to one end. The tubular body 2 is made of a material which is nonporous with respect to liquids and gases and is capable of being heated to the melting point of the metal or alloy to be handled without undergoing any distortion or degradation. Preferably tube 2 is made of a ceramic or metallic composition having a melting point higher than that of the metal or alloy to be handled but it is appreciated that a high temperature glass might be used in some cases. Also tube 2 preferably is not wettable by a melt of the metal or alloy to be handled.

The end cap 4 may be made of the same material as the tube 2, or it may be made of a different non-porous material capable of withstanding the operating environment of the forming tool. In either case it has a tubular extension 6 which communicates with the interior of tube 2 and is connected to a flexible hose or pipe 8 leading to a source of vacuum (not shown). The vacuum source typically is a motor driven vacuum pump capable of creating a suitable negative pressure within tube 2. The opposite end of tube 2 is closed off by an end wall in the form of a disk 10 which has a selected porosity, is not wettable by and has a higher melting point than the metal or alloy to be handled, and is not attacked or dissolved by the same metal or alloy. Disk 10 may be attached to tube 2 by use of a suitable high temperature cement, by fusing or welding, or by other suitable means known to persons skilled in the art. The lower surface of disk 10 is coated with a layer 12 of a material which is nonporous and not wettable by the metal or alloy to be handled. Layer 12 also has a higher melting point than and is not attacked or dissolved by the metal or alloy to be handled. Preferably, layer 12 is a ceramic glaze, but it may also be a preformed ceramic plate (such as one made from the FOTOFORM® and FOTOCERAM® glass-ceramic materials produced by Corning Glass Works, Corning, New York) or an oxidized etched metal sheet having a suitable non-wetting characteristic. Layer 12 functions as a mask to define the shape of the component to be formed. In this case, the tool is intended to be used to form two parallel wire leads; therefore, layer 12 covers all of the lower surface of disk 10 except for two elongate narrow and mutually parallel areas 14 and 16 which coact with the adjacent edges of layer 12 to form grooves or trenches 15 that define the shape and relative positions of the two wire leads to be formed. The tool is completed by coating the circumferential surface of disk 10 and the adjacent portion of the outer surface of tube 2 (and preferably also the periphery of glaze layer 12) with a layer 18 of a material that also is non-porous and non-wettable by the metal or alloy to be handled, and also has a higher melting point than and resists attack or dissolution by the same metal or alloy. If desired, layers 12 and 18 may be made of the same material. In any event the layer 18 seals off the peripheral surface of disk 10 (and also its junction with tube 2) so that the only areas of disk 10 which are exposed to the atmosphere and are available to be contacted by the metal or alloy are areas 14 and 16.

The disk 10 comprises a multitude of pores which (a) are large enough to rapidly pass air or any component thereof (or whatever other gas, e.g. helium or argon, may constitute the surrounding atmosphere) when a suitable vacuum force is applied to its upper side via hose 8, and (b) are small enough so that the liquid metal or alloy to be handled will not be sucked through the disk at the vacuums employed. Preferably the pores in disk 10 are of capillary size and have a diameter which is at least about one order of magnitude less than the width of the areas 14 and 16 (the width of areas 14 and 16 is the horizontal dimension as viewed in FIG. 2). As a practical matter, the diameters of the pores of disk 10 should be in the range of about 40A to about 50 microns, with the smaller pore sizes being preferred with a relatively thin disk and the larger pore sizes being preferred for a relatively thick disk. By way of example, a disk measuring 0.10 inch thick with a pore size of 50° A may be used, as may a disk measuring 0.25 inch thick with pore sizes of about 50 microns.

The degree of vacuum that is required to be applied to the tool must be large enough to draw the molten melt or alloy up into the two wire-defining grooves 15 formed by glaze coating 12, but not large enough to draw the molten metal into the pores of the disk 10. The minimum sucking force required to be exerted by evacuating the tube 2 is proportional to the surface tension of the molten metal and inversely related to the width of grooves 15, and hence to some extent the degree of partial vacuum required to be established in the tool will vary with the composition of the molten metal and the groove geometry.

FIG. 5 illustrates how the applied vacuum tends to pull the melt 22 up into the pores or capillaries 11 which are formed between the grains 10A of porous disk 10. In FIG. 5, the sucking force produced by the applied vacuum is represented by the two upwardly directed arrows while the opposing force provided by the surface tension of the melt is represented by the three downwardly directed arrows. The sucking force must not be so great as to cause the melt to be sucked up through the pores 11. Hence the maximum vacuum which can be used is one where the sucking force is in balance with the opposing surface tension force. The magnitude of the negative pressure required to suck the molten metal into the grooves 15 and to hold it there (as hereinafter described) also is affected by the thickness and porosity of the disk 10. Typically, a pressure of about 2-5 psi will suffice to draw molten metal up into the wire-defining grooves. However, even lower pressures, e.g. 0.5 to 1.0 psi, may be employed or required in some cases.

FIGS. 4A-4D show how one wire is formed and deposited using the forming tool of FIG. 1-3. The process involves four discrete steps. First of all, with a vacuum pump (not shown) establishing via hose 8 a partial vacuum (i.e. a negative pressure) inside of tube 2, the bottom end of the tool is lowered into a melt 22 of a selected metal or alloy, e.g. a solder composition. The tool is maintained in this position long enough for it to reach the melt temperature and for the melt to fill each of the grooves 15 and cover the exposed areas 14 and 16 of disk 10. Next, (FIG. 4B) the tool is withdrawn from the melt while the vacuum pump continues to maintain the negative pressure in tube 2. As the tool is withdrawn the melt will be held in each of the grooves 15 by suction while the melt will separate from the glaze layer 12. Depending upon the surface tension of the melt, the suction force, and the rate of withdrawal of the tool from the melt, the grooves 15 may be filled so that the adhering melt 24 protrudes slightly below the surface of glaze layer 12 (as shown in FIG. 4B), or is substantially flush with glaze layer 12, or the grooves may be filled to only a part of their depth; in each case it is possible to form and deposit a wire of the approximate width of the areas 14 and 16.

The third step (FIG. 4C) is to position the forming tool over a selected surface and then lower the forming tool into contact with the selected surface. This step is carried out fast enough to assure that the metal or alloy in the grooves 15 is still molten or at least has not already frozen solid when the tool contacts the selected surface. In FIG. 4C, the forming tool is disposed over a printed circuit board 26 having a wettable terminal pad or contact 28 to which one end of a wire lead is to be connected. The forming tool is lowered so that its glaze coat contacts the pad 28 and so that one end of one of the grooves 15 is in registration with the pad. The tool is held there long enough for the molten metal to at least partially solidify in contact with the pad, the solidifying being due to direct radiation of heat to the atmosphere by glaze layers 12 and 18 and by loss of heat by conduction to the printed circuit board. The fourth and final step (FIG. 4D) is to release the vacuum, i.e., raise the pressure in tube 2 to the pressure level of the surrounding atmosphere, and simultaneously or thereafter raise the tool away from the printed circuit board, with the result that the metal or alloy separates from the tool and remains behind on the printed circuit as a straight wire 30 with one end firmly bonded to terminal pad 28. Whether or not the other end or any other part of the wire forms a bond with the printed curcuit board depends upon whether or not the confronting portion of the board is wettable by the melt carried by the forming tool. Thus, if when the melt solidifies each end of the resulting wire is in contact with a wettable terminal pad and the remainder of the wire is in contact with a non-wettable portion of the printed circuit board, the ends of the wire will be bonded to the pads but the remainder will not be bonded to the board but instead will be self-supporting and will span the two pads. Of course, if a third wettable terminal pad is contacted by another portion of the same molten metal, the result will be a wire strip bonded to and connecting three terminal pads.

By way of example, thin wires made of Wood's Metal can be made with a forming tool made as described above wherein the tube 2 is alumina, the porous disk, 10 is a piece of standard wall tile made of an aluminum silicate and having a maximum pore size of about 10–20 microns, the layers 12 and 18 form on continuous coating of a silicate glaze with layer 12 measuring about 0.002 inch thick, and the width of the exposed areas 14 and 16 is about 0.005 inch. The same tool may be used to form and bond wires made of other materials, e.g. an alloy consisting on a weight basis of 73% gold and 27% germanium. Other materials which can be formed and bonded by the present invention are conventional solders such as tin-lead or silver-bearing solder, or other fusible alloys such as alloys based on indium or bismith. By making the porous body 10 and non-porous coating 12 of a more refractory material, e.g. mullite or alumina, it is possible to produce gold, copper and silver forms according to this invention. While the invention is preferably practiced with metals or alloys melting below 300° C, it also may be used with metals or alloys having melting points as high as 800° C. The alloys useable with this invention may consist of eutectic and non-eutectic combinations of metallic elements.

In the simplest mode of practicing the invention, the forming tool is heated to the extent necessary to maintain the metal or alloy molten by keeping it immersed in the melt long enough to reach the melt temperature. However, as an alternative, the tool may be fitted with means for heating it. Thus, as shown in FIG. 6, an electrical heater in the form of an electrical resistance wire heating coil 32 may be disposed about and secured to the bottom end of tube 2. As a further alternative, the heating element 32 could be mounted within the tube, or could be embedded directly in the wall of tube 2 as shown by the dotted line representation 32A in FIG. 2. Of course, the electrical heating element is connected to a suitable source of a.c. or d.c. electrical power and switch means (not shown) are provided in the power circuit to control the flow of current and thus the temperature of the tool. The tool is heated so that the temperature of the porous disk 10 and layer 12 are close to but above the melting point of the metal or alloy constituting the melt 22. If the temperature of the disk 10 and layer 12 exceeds the melting point of the metal by an excessive amount, the metal may spread out too much on the wettable surface to which it is to be bonded, e.g. pad 28, before it solidifies. Of course, shutting off the flow of current to the heater to reduce its temperature will assist in getting the metal to solidify rapidly upon contact with the wettable surface to which it is to be bonded. Preferably, however the heater is operated so that the disk 10 and layer 12 do not exceed the melting point of the metal by about 10°–20° C.

Because of its capability of making very thin wire leads and bonding them to selected substrates or electrical components, the invention may be used advantageously to produce and deposit an array of metal wires corresponding to a lead frame for a semiconductor chip. FIG. 7 illustrates an array of leads for a semiconductor chip that may be produced with a forming head of the present invention. In this case the glaze layer 12 of the forming head is arranged to expose a plurality of areas of the bottom surface 10, with the exposed areas being shaped so that when it is used in the manner described above for the tool of FIGS. 1–3, a plurality of elongate narrow wire leads 34 are formed with each lead having a substantially square terminal section 36. The latter are disposed as a generally rectangular array and the other ends of leads 34 terminate at points along a square perimeter 38. An array of leads as shown in FIG. 7 may be formed so that their inner ends are bonded to terminal contacts on a semiconductor chip that occupies the space defined by perimeter 38 and their terminal sections 36 are bonded to terminal pads on a circuit board to which the chip is attached. The leads 34 may be formed simultaneously with proper disposition of the forming tool assuring exact registration of the leads with the corresponding contacts and terminal pads of the IC chip and circuit board.

It is to be appreciated that a tool embodying the present invention may be made other than as shown in FIGS. 1–3. Thus the pattern of grooves in the layer 12 may be formed by milling away part of the layer or by etching with a suitable etching medium. The compositions of layers 12 and 18 and also of the porous body 10 may be changed according to the particular metal or alloy to be handled so as to assure that they are sufficiently refractory and not wettable by the particular metal or alloy. Also, while the tool may be used manually, it is to be understood that it may be attached to an automatic mechanism which is adapted to cause it to undergo the motions necessary to repeatedly carry out the procedure illustrated in FIGS. 4A–4D.

It also is contemplated that the melt-receiving groove or grooves in the bottom end of the tool may be of varying depth so as to permit formation of metal wires or other forms that have portions with different thicknesses. Furthermore the bottom face of the porous disk 10 need not be flat but instead may be shaped so that as viewed in side elevation, the melt-receiving groove is contoured, whereby the side elevation profile of the resulting metal form is angular or curved. This latter modification is illustrated in FIG. 8 (which corresponds to a view taken at a right angle to the view of FIG.2) where the bottom face 44 of the disk 10 is contoured and the non-porous layer 12 is of uniform thickness, whereby the depth of the groove 15 is uniform but the groove undulates along its length. With a tool constructed as shown in FIG. 8, it is possible to produce wire forms where the end sections are offset from the center section. Such a tool is useful, for example, where it is desired to apply a conductive wire (1 ) to an integrated circuit chip so that the opposite ends of the wire are bonded to terminal pads and the center section of the wire bridges an integrated circuit component located between the terminal pads or (2) to a stepped substrate.

Still another possible modification is to provide the tool with cooling means to assist in selectively freezing the melt which is held in the melt-receiving grooves. Thus, for example, where it is desired to form a metal wire where both ends are bonded to terminal pads on a printed circuit board and the remainder of the wire is not bonded, a metal heat sink may be embedded in the rear or upper side of the disk 10 over a selected portion of the melt-receiving groove, whereby the melt in that portion of the groove will tend to remove heat faster than the melt in the ends of the groove, and thus will solidify first. By properly timing movement of the tool from the melt to the printed circuit board, the melt in the groove will be converted to a wire whose ends are bonded to the terminal pads while the remainder thereof is self-supporting and not bonded to the board. It is also possible to selectively cool the tool by providing a cooling means around the body 2 or embedded in the wall of the body 2, in the manner of the heating coils 32 and 32A. Such cooling means may take the form of metallic heat sinks or heat radiators; alternatively the heating means may comprise a hollow tube through which a selected cooling fluid is circulated. Other means of selectively cooling the tool will be obvious to persons skilled in the art. The cooling means may be designed to remove heat from all or only selected portions of the grooves 15, depending upon whether the purpose of the cooling is to expedite the deposition or to effect solidification of selected portions of the melt in the grooves before release by termination of the vacuum force.

The invention also may be used to fabricate parts without at the same time bonding the parts permanently to the surface on which the parts are deposited. Thus, for example, a metal part or desired shape may be deposited onto a receiving surface which is wettable but which nevertheless does not make a permanent bond, whereby the deposited part may be peeled off of the receiving surface for use elsewhere. Furthermore, the invention is not limited to the formation of connecting leads and may be used to make other products. Thus, by appropriately forming the masking surface 12, the invention may be used to form metal strain gages (e.g. of the type disclosed by H. N. Norton, Handbook of Transducers For Electronic Measuring Systems, pp. 557–564, Prentice-Hall, Inc. 1969), metal film electrical resistors, printed circuit boards, and jewelry and other parts involving intricate filigree.

We claim:

1. Method of forming a material from the class consisting of metals and alloys as a solid part having a predetermined geometry, said method comprising the steps of:
   a. providing a hollow body having at one end a porous surface and a non-porous surface that are made of substances which are not wettable by said material and are disposed so that a selected area of said porous surface is exposed through an opening in said non-porous surface;
   b. immersing said one end of said hollow body in a melt of said material far enough so that said selected area of said porous surface contacts said melt;
   c. withdrawing said one end of said hollow body from said melt with at least a portion of said selected area of said porous surface and at least a portion of said non-porous surface at a temperature at least as high as the melting point of said material,
   d. providing a suction force on said porous surfaces as said body is withdrawn from the melt so as to cause a portion of said melt to adhere in liquid form to said selected area of said porous surface by suction; and
   e. thereafter cooling the adhering portion of said melt by removing heat from said one end of said hollow body and removing said suction force so that said adhering portion is released from said porous surface and forms a solid part having substantially the same geometry as the exposed area of said porous surface.

2. Method according to claim 1 wherein said porous surface is part of a porous member whose pores are in the range of from about 40 A to about 50 microns.

3. Method according to claim 2 wherein said porous and non-porous surfaces are made of a substance from the class consisting of alumina, mullite and an aluminum silicate.

4. Method according to claim 3 wherein said material is a member of the class consisting of (a) a gold alloy, (b) Wood's metal, (c) a tin-lead solder, (d) a silver-bearing solder, (e) a fusible alloy containing indium, and (f) a fusible alloy containing bismith.

5. Method according to claim 1 wherein said one end of said body is held immersed in said melt at least until said porous and non-porous surfaces have reached substantially the same temperature as said melt.

6. Method according to claim 1 wherein said suction force is applied before said one end of said body is immersed in said melt.

7. Method according to claim 1 wherein said suction force is terminated after said adhering portion of melt has undergone at least partial solidification.

8. Method according to claim 1 wherein said one end of said body is brought into contact with a receiving surface after it is withdrawn from the melt and before said suction force is terminated, whereby said adhering portion of melt is released and forms a solid part on said receiving surface.

9. Method according to claim 1 wherein said porous surface is made of a ceramic material.

10. Method according to claim 1 wherein said exposed porous surface is recessed with respect to said non-porous surface so that a cavity is formed by said porous and non-porous surfaces, and said adhering portion of melt fills said cavity.

11. Method according to claim 1 wherein said non-porous surface is flat.

12. Method according to claim 1 wherein said non-porous surface is part of an oxidized etched metal sheet.

13. Method according to claim 1 wherein said solid part is in the form of a wire.

14. Method of forming a material from the class consisting of metals and alloys as a solid part having a predetermined geometry, said method comprising the steps of:
   a. providing a hollow body with a porous surface and a non-porous surface that are made of substances which are not wettable by said material and are disposed so that a selected area of said porous surface is exposed through an opening in said non-porous surface;
   b. immersing said body in a melt of said material so that said non-porous surface and said selected area of said porous surface contact said melt and attain a temperature at least as high as the melting point of said material;
   c. withdrawing said body from said melt;
   d. providing a suction force on said porous surface as said body is withdrawn from the melt so as to cause a portion of said melt to adhere to said selected area of said porous surface by suction;
   e. bringing said body into contact with a receiving surface which is wettable by said melt and cooling the adhering portion of said melt by removing heat from said body; and
   f. removing said suction force so that said adhering portion of said melt is released from said porous surface and forms a solid part having substantially the same geometry as said selected area of said porous surface.

15. Method according to claim 14 wherein said receiving surface is a metal.

16. Method according to claim 15 wherein said receiving surface is part of an electrical circuit component.

17. Method according to claim 14 wherein said adhering portion of melt is cooled enough to solidify after it is brought into contact with said receiving surface.

* * * * *